United States Patent [19]

Murakami et al.

[11] Patent Number: 4,587,438
[45] Date of Patent: May 6, 1986

[54] TURN-OFF CIRCUIT FOR GATE TURN-OFF THYRISTOR

[75] Inventors: Koichi Murakami, Glenview, Ill.; Katsuyoshi Mase, Kawasaki, Japan

[73] Assignee: Tokyo Shibaura Denki Kabushiki Kaisha, Japan

[21] Appl. No.: 568,912

[22] Filed: Jan. 6, 1984

[30] Foreign Application Priority Data

Jan. 12, 1983 [JP] Japan ................................ 58-3014

[51] Int. Cl.$^4$ .......................................... H03K 17/72
[52] U.S. Cl. ............................... 307/252 C; 363/129
[58] Field of Search ................. 307/252 C; 363/128, 363/129

[56] References Cited

U.S. PATENT DOCUMENTS 3,551,781 12/1970 Smith ................................. 363/128
4,464,585 8/1984 Seki ................................. 307/252 C

FOREIGN PATENT DOCUMENTS 0087626 6/1982 Japan ............................. 307/252 C Primary Examiner—John Zazworsky
Attorney, Agent, or Firm—Finnegan, Henderson, Farabow, Garrett & Dunner

[57] ABSTRACT

A turn-off circuit for GTOs has a three-phase, full-wave rectifier. The output voltage of the three-phase, full-wave rectifier is applied as a turn-off power source to a charge/discharge capacitor.

8 Claims, 6 Drawing Figures

TURN-OFF CIRCUIT FOR GATE TURN-OFF THYRISTOR

BACKGROUND OF THE INVENTION

The present invention relates to a turn-off circuit in use for gate turn-off thyristors (GTOs) widely used in, for example, large power inverters.

Conventional gate turn-off circuits for GTOs are arranged as shown in FIGS. 1 and 2. Basically, this type circuit is arranged so that a sharply rising pulse with a high peak value is formed by a pulse transformer, and a pulse such as a gate turn-off current is applied to the cathode gate path of the GTO. As shown in FIG. 1 a DC power source 1 is for turning off the GTO. A diode 2 is for preventing reverse flow of the current to the DC power source 1. A pulse transformer 3 has two segmented primary windings 4 and 5. An NPN transistor 6 is inserted between the battery 1 and the primary winding 5. As shown, the circuit components 1, 2, 4, 5 and 6 constitute a series circuit. A capacitor 8 is connected across a series connection of the primary winding 5 and the transistor 6. The primary windings 4 and 5 and a secondary winding 7 of the pulse transformer 3 are polarized as indicated by black dots which represent a high potential. A base control circuit 9 is connected to the NPN transistor 6 for controlling the base potential of the NPN transistor 6.

The base control circuit 9 is coupled with a control signal generating circuit 13. The control signal generating circuit 13 applies a turn-off signal to the base control circuit 9 and a gate control circuit 12 and a turn-on signal to a turn-on circuit 14. The secondary winding 7 and a thyristor 11, arranged in series fashion, are connected between the gate and the cathode of a GTO 10. The gate control circuit 12 is connected to the thyristor 11 for controlling the gate potential. The turn-on circuit 14, connected to the GTO 10, is driven by the control signal generating circuit 13 to turn the GTO 10 on.

The operation of the turn-off circuit shown in FIG. 1 will be given. For simplicity of explanation, it is assumed that the turn ratio of the primary windings 4 and 5 of the pulse transformer 3 is 1:1, and that the turn ratio of the primary windings and the secondary winding is n:1. In a stationary state, a voltage Ec across the capacitor 8 is higher than that of the DC power source 1, Ec>E. This will be explained later. In this state, the diode 2 is reversely biased. The control signal generating circuit 13 has applied a turn-on signal to the turn-on circuit 14. The GTO 10, under control of the turn-on signal from the turn-on circuit 14, is in an ON state.

Under this condition, a turn-off signal with a predetermined pulse width is output from the control signal generating circuit 13. The signal is applied to the base control circuit 9 and the gate control circuit 12. Upon receipt of the turn-off signal, the base control circuit 9 and the gate control circuit 12 amplify the turn-off signal and apply a base-on signal and a gate-on signal to the NPN transistor 6 and the thyristor 11, respectively. The NPN transistor 6 and the thyristor 11 are turned on. At this time, the voltage Ec across the capacitor 8 is applied across the primary winding 5 of the pulse transformer 3 to induce a voltage Ec across the primary winding 4. Therefore, the potential at point A of the primary winding 4 connected to the diode 2 is 2 Ec. Accordingly, the diode 2 is reverse-biased, so that no current flows from the DC power source 1 to the pulse transformer 3. In this case, a voltage Ec/n appears in the secondary winding 7 of the pulse transformer 3.

The charge stored in the capacitor 8 is discharged at a time constant $R1 \times C$, where R1 is the equivalent resistance of the GTO 10 in the secondary winding when the equivalent resistance is converted in the primary winding 5, and C is the capacitance of the capacitor 8. At this time, an off-gate current, i.e. turn-off gate current, flows through the cathode-gate path in the secondary winding 7 of the pulse transformer 3. A waveform of the turn-off gate current can be shaped to have a sharp rising and a large peak value, by properly selecting the capacitance of the capacitor 8 and the inductance of the pulse transformer 3. As the discharge of the capacitor 8 progresses, the voltage across the capacitor 8 drops to E/2. At this time, the potential at point A is equal to the power source voltage E. When the potential at point B drops to below E/2 with further progression of the discharge of the capacitor 8, the diode 2 is forward-biased. Accordingly, the current from the DC power source 1 flows through a path containing the DC power source 1, the diode 2, the primary windings 4 and 5 and the NPN transistor 6. As a result, the voltage E/2 appears across the primary winding 4 of the pulse transformer 3. The reduced voltage E/2n is induced across the secondary winding 7. A relatively small current is supplied to the cathode-gate path of the GTO 10.

Under this condition, when the turn-off signal terminates and the transistor 6 is turned off, a voltage of inverse polarity is induced across the secondary winding 7 of the pulse transformer 3. The result is that the thyristor 11 is reverse-biased, the current flowing through the cathode-gate path of the GTO 10 disappears, and the GTO 10 is completely turned off. The above is the operation for turning off the GTO 10 in the turn-off circuit of FIG. 1. At the time of turn off, the current from the DC power source 1 flows into the capacitor 8 to charge the capacitor 8. The exciting energy of the pulse transformer 3 is stored in the capacitor 8 when the NPN transistor 6 is turned off. Therefore, the voltage across the capacitor 8 is approximately (Ec+2E) and the diode 2 is reverse-biased.

Another example of the prior art is shown in FIG. 2. For simplicity, only the portions of this example that differ from the previous one will be discussed. As shown, this example additionally contains two resistors 15 and 18 and two diodes 16 and 17. The resistor 15 and the diode 16 are connected in series between the positive side of the DC power source 1 and junction B between the primary windings 4 and 5. The resistor 15 is a charging resistor. The capacitor 8 is connected between a junction between the resistor 15 and diode 16 on one hand and the negative side of the power source 1 on the other hand. The diode 16 is for preventing current flow from the primary winding 4 to the capacitor 8. The diode 17 and the resistor 18 are connected across the primary windings 4 and 5, respectively. The combination of the diode 17 and the resistor 18 provides a circulating path to the exciting energy flow from the primary windings 4 and 5.

In the operation of FIG. 2, the assumptions made regarding the operation of FIG. 1 also apply. In a stationary state, the capacitor 8 is fed with a charge current from the DC power source 1 via the charge resistor 15. The voltage across the capacitor 8 is equal to the voltage of the DC power source 1.

Under this condition, a turn-off signal with a predetermined pulse width is generated by the control signal generating circuit 13. Upon receipt of the generated turn-off signal, the base control circuit 9 and the gate control circuit 12, respectively, produce and apply the base-on signal and the gate-on signal to the NPN transistor 6 and the thyristor 11. The NPN transistor 6 is turned on to allow the charge stored in the capacitor 8 to be discharged through the diode 16. The discharge current flows into the primary winding 5 to induce a voltage E/n in the secondary winding 7. At this time, the potential at the high potential point A of the primary winding 4 is 2E. Since 2E>E, the diode 2 is reverse-biased to prevent the reverse current from flowing from the DC power source 1 to the pulse transformer 3. With progression of the discharging from the capacitor 8, the voltage across the capacitor 8 drops to E/2. At this time, the potential at the point A is equal to the power source voltage. When, the capacitor 8 is further discharged and the potential at point B drops to below E/2, the diode 2 is forward-biased. Then, the current flows through a route containing the DC power source 1, the diode 2, the primary windings 4 and 5 and the transistor 6. A voltage E/2n is induced across the secondary winding 7, so that a relatively small current flows through the cathode-gate path of the GTO 10.

Next, the turn-off signal terminates and the NPN transistor 6 is turned off. At this time, voltage is induced acorss the secondary winding 7 of the pulse transformer 3 with a polarity opposite to that of the previously induced voltage. Such induced voltage reverse-biases the thyristor 11 and turns off the thyristor 11 to cut off the current flowing through the cathode-gate of the GTO 10. In this way, the GTO 10 is completely turned off. When the NPN transistor 6 is turned off, the energy in the primary windings 4 and 5 of the pulse transformer 3 circulates through the diode 17 and the resistor 18, thereby preventing an overvoltage from being applied to the NPN transistor 6.

As described above, the turn-off circuit for the GTO requires a separate DC power source for the turn-off operation, as shown in FIGS. 1 and 2. This is undesirable particularly for an apparatus incorporating a plurality of GTOs such as a large power inverter. Such an apparatus uses a plurality of small DC power sources or a single large DC power source. This leads to increase in size, weight and cost. For turning off the large capacity or high frequency GTO, the power capacity of the DC power source is often insufficient. Further, a relatively large capacitor (not shown in FIGS. 1 and 2), just be connected in parallel to the DC power source. This fact makes the above problems critical.

SUMMARY OF THE INVENTION

Accordingly, an object of the present invention is to provide a turn-off circuit for gate turn-off thyristors which is small, light, and inexpensive.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, there is provided a turn-off circuit for a gate turn-off thyristor comprising a three-phase full-wave recitifer for full-wave rectifying three-phase AC voltages, and having a pair of output terminals, a pulse transformer having primary and secondary windings, a switching element, said primary winding of said pulse transformer and said switching element connected in series between said pair of output terminals of said rectifier, a charge/discharge capacitor connected at one end to one of the pair of said output terminals of said rectifier, and at the other end to a predetermined point of said primary winding, a gate turn-off thyristor connected to receive a turn-off current through said secondary winding of said pulse transformer, and a control circuit for receiving a turn-off signal with a predetermined pulse width to turn on said switching element so that said gate turn-off thyristor receives a turn-off current through said secondary winding of said pulse transformer and is turned off.

The accompanying drawings, which are incorporated in and constitute a part of this specification, illustrate several embodiments of the invention and, together with the description, serve to explain the principles of the invention.

DETAILED DESCRIPTION OF THE PREFERRED EMBODIMENTS

Figure 3:
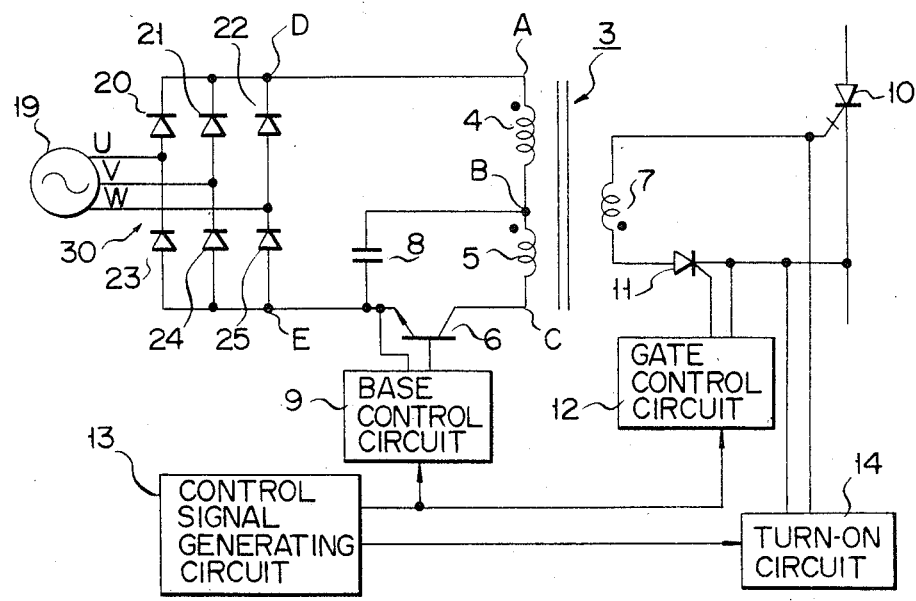
FIG. 3 is a circuit diagram of an embodiment of a turn-off circuit for GTOs constructed according to the present invention.
Figure 4:
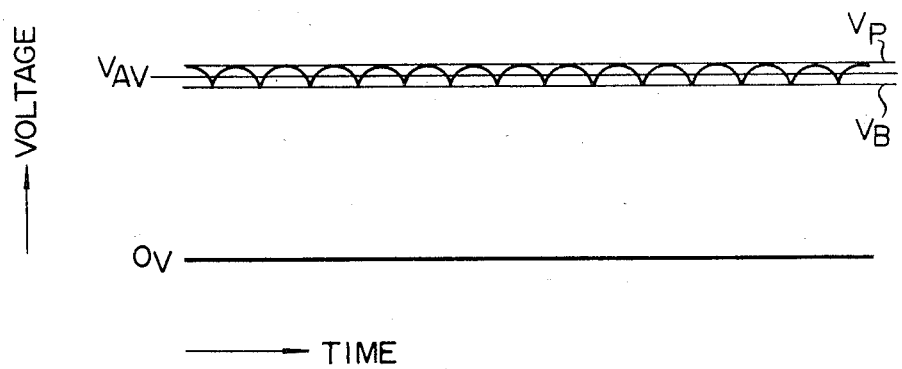
FIG. 4 shows waveforms relating to an output voltage of a three-phase full wave rectifier in the turn-off circuit shown in FIG. 3.

A first embodiment of a turn-off circuit for GTOs according to the present invention will be described referring to FIGS. 3 and 4 illustrating a circuit diagram of an embodiment of a turn-off circuit according to the present invention and waveforms relating to the output voltage of a three-phase full wave rectifier used in the turn-off circuit. In FIG. 4, the abscissa represents time, while the ordinate voltage.

As shown in FIG. 3, a three-phase AC power source 19, as a general drive power source in the apparatus incorporating GTOs, is provided as a power source for turning off the GTO 10. A three-phase full wave rectifier 30 provided at the output of the three-phase AC power source 19, full-wave rectifies the three-phase alternating current from the power source 19. The rectifier 30 is comprised of pairs of diodes 20 and 23, 21 and 24, and 22 and 25. Each pair is serially connected in a forward-to-back manner. Specifically, the diodes 20 to 22 are connected together at the cathodes, providing a positive potential. On the other hand, the diodes 23 to 24 are connected together at the anodes, providing a negative potential. A positive potential provided at point D is connected to point A of the primary winding 4. A negative potential provided at point E is connected to a connection point of the capacitor 8, the emitter of the NPN transistor 6 and the base control circuit 9.

The pulse transformer 3, including the primary windings 4 and 5, and the NPN transistor (bipolar type) 6 are connected in series between the high potential point D of the rectifier 30 and the low potential point E. The capacitor 8 is connected between point E of the rectifier 30 and point B of the primary side of the pulse transformer 3. Polarity of the voltages in the primary and secondary windings of the pulse transformer 3 are shown by black dots representing positive polarity. A base control circuit 9 is connected to the NPN transistor 6 for controlling the base potential of the NPN transistor 6. The base control circuit 9 is coupled to a control signal generating circuit 13. Upon receipt of the turn-off signal from the generating circuit 13, the base control circuit 9 amplifies the turn-off signal and applies the amplified signal to the base of the transistor 6. Then the transistor 6 is turned on. When the turn-off signal terminates, the signal being generated from the base control circuit 9 ends. Thus the transistor 6 is turned off.

The secondary winding 7 and a thyristor 11, arranged in series fashion, are connected between the gate and the cathode of a GTO 10. The anode and cathode of the thyristor 11 are connected to the gate and cathode of the GTO 10, respectively, A gate control circuit 12 is connected to the thyristor 11 for controlling the gate potential. The gate control circuit 12 is connected to the control signal generating circuit 13. Upon receipt of the turn-off signal from the generating circuit 13, the gate control circuit 12 amplifies the turn-off signal and applies the amplified signal to the gate of the thyristor 11. The thyristor 11 is turned on. A turn-on circuit 14 is connected between the cathode and gate of the GTO 10. Upon receipt of a turn-on signal from the generating circuit 13, the turn-on circuit 14 amplifies the turn-on signal and applies the amplified signal to the gate of the GTO 10. The GTO 10 is turned on. The control signal generating circuit 13 produces the turn-on signal when the GTO 10 is to be turned on and the turn-off signal when the GTO 10 is to be turned off. The generation circuit 13, as described above, is connected to the base control circuit 9, gate control circuit 12 and the turn-on circuit 14. The generation circuit 13 applies the turn-off signal to the base control circuit 9 and gate control circuit 12 and the turn-on signal to the turn-on circuit 14.

The operation of the turn-off circuit shown in FIG. 3 will be given in reference to FIG. 4 which illstrates a pulsating waveform of the voltage between the points D and E. In FIG. 4, $V_p$ represents a peak value of the pulsative waveform, $V_{AV}$ its average value, and $V_B$ its lower limit value. For simplicity of explanation, it is assumed that the turn ratio of the primary windings 4 and 5 of the pulse transformer 3 is 1:1. This case is equivalent to a circuit in which the capacitor 8 is connected to a mid-point of a single primary winding. It is further assumed that a turn ratio of the primary windings and the secondary winding is n:1. In a stationary state, a voltage Ec across the capacitor 8 is higher than the mean output voltage of the rectifier 30, $Ec > E_{AV}$. This will be explained later. Therefore, the diodes 20 to 25 are reverse-biased. Under this condition, the control signal generating circuit 13 produces a turn-on signal. The GTO 10, under control of the turn-on signal from the turn-on circuit 14, is in an ON state.

Under this condition, a turn-off signal with predetermined pulse width is output from the control signal generating circuit 13. The signal is applied to the base control circuit 9 and the gate control circuit 12. Upon receipt of the turn-off signal, the base control circuit 9 and the gate control circuit 12 amplify the turn-off signal and apply a base-on signal and a gate-on signal to the NPN transistor 6 and the thyristor 11, respectively. Then, the NPN transistor 6 and the thyristor 11 are turned on. At this time, the voltage Ec across the capacitor 8 is applied to the primary winding 5 of the pulse transformer 3 to induce a voltage Ec across the primary winding 4. Therefore, the potential at point A of the primary winding 4 is 2 Ec. Accordingly, the diodes 20 to 25 are reverse-biased, so that no current flows from the power source 19 to the pulse transformer 3. In this case, a voltage Ec/n appears across the secondary winding 7 of the pulse transformer 3. Charges stored in the capacitor 8 are discharged at a time constant $R1 \times C$, where R1 is the equivalent resistance of the GTO 10 in the secondary winding when it is converted into the equivalent resistance in the primary winding 3, and C is the capacitance of the capacitor 8. At this time, an off-gate current i.e. turn-off gate current flows into the cathode-gate path in the secondary winding 7 of the pulse transformer 3. A waveform of the turn-off current can be shaped to have a sharp rising and a large peak value, by properly selecting the capacitance of the capacitor 8 and the inductance of the pulse transformer 3.

As the discharge of the capacitor 8 progresses, the voltage across the capacitor 8 reduced up to $V_{AV}/2$. At this time, the potential at point A is equal to the power source voltage. When the potential at point B drops to below $V_{AV}/2$ with further progression of the discharge of the capacitor 8, the diodes 20 to 25 are forward-biased. Accordingly, the current from the three-phase power source 19 flows through a route containing the primary windings 4 and 5 and the NPN transistor 6. As a result, the voltage $V_{AV}/2$ appears across the primary winding 4 of the pulse transformer 3. The reduced voltage $V_{AV}/2n$ is induced across the secondary winding 7. A relatively small current is supplied to the cathode-gate path of the GTO 10.

Under this condition, when the turn-off signal terminates and the transistor 6 is turned off, a voltage with inverse-polarity is induced across the secondary winding 7 of the pulse transformer 3. The result is that the thyristor 11 is reverse-biased to be turned off, the current flowing through the cathode-gate path of the GTO 10 disappears, and the GTO 10 is completely turned off. The above is the operation for turning off the GTO 10 in the turn-off circuit of FIG. 3.

At the time the GTO 10 is turned off, the current from the power source 19 flows into the capacitor 8 to charge the capacitor 8. The exciting energy of the pulse transformer 3 is also stored in the capacitor 8 when the NPN transistor 6 is turned off. Therefore, the voltage across the capacitor 8 is approximately $(Ec + 2V_{AV})$ and the diodes 20 to 25 are reverse-biased.

Figure 1:
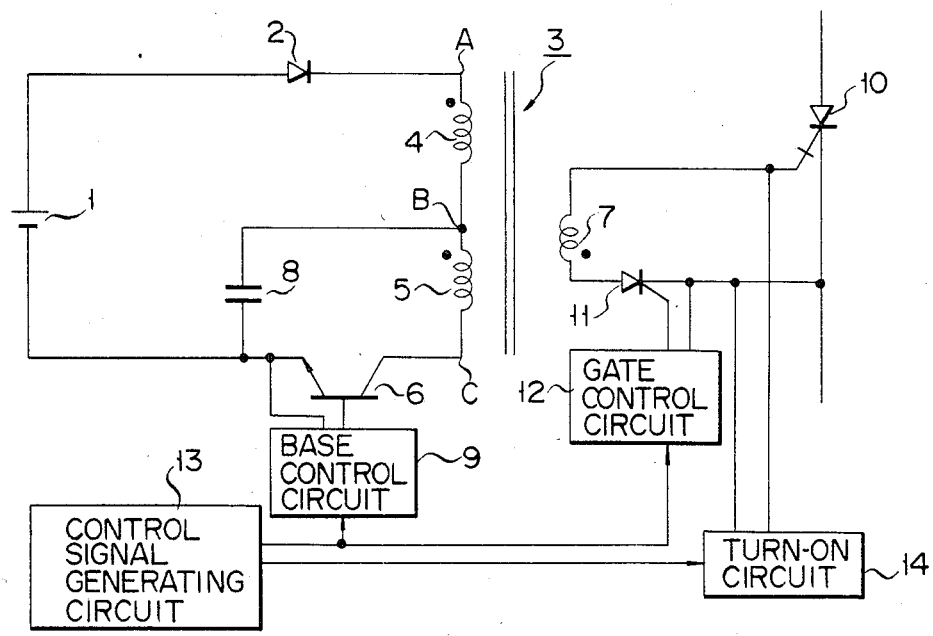
FIG. 1 is a circuit diagram of a prior art turn-off circuit for GTOs according to the present invention.
Figure 2:
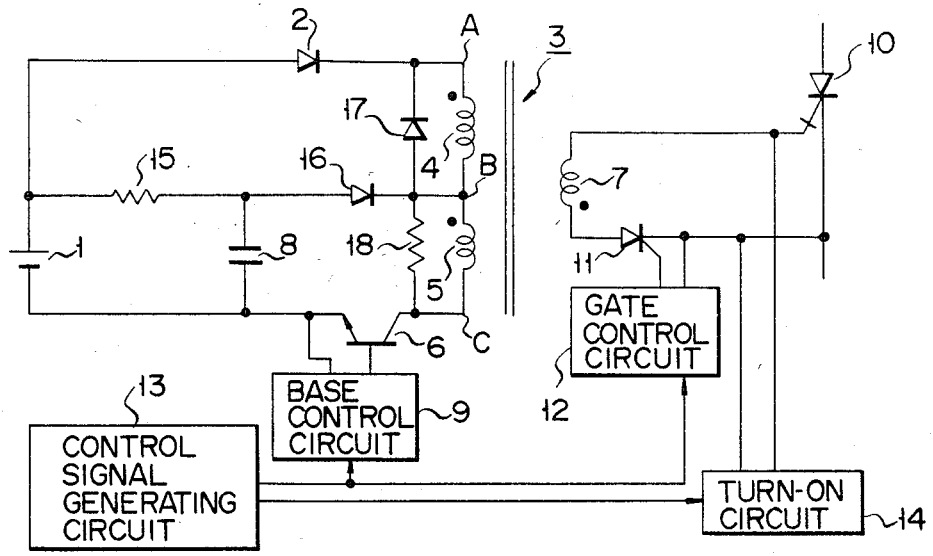
FIG. 2 is a circuit diagram of another example of the prior art.

As seen from the foregoing description, the present embodiment employs a combination of the three-phase AC power source 19 and the three-phase full wave rectifier 30, which is substituted for the combination of the DC power source 1 and the diode 2 for reverse current prevention. By the output DC voltage from the three-phase full wave rectifier 19, th present embodiment, like the FIG. 1 circuit, can turn off the GTO 10. Further, a separate DC power source and its associated large capacitor, essential to the prior art, is not necessary for the present invention. Further, with the use of the three-phase AC voltage, the turn-off circuit of this invention can cope with the increase of the power source capacitor resulting from increasing the capacity and the operating frequency of the GTOs. Further, the diodes 20 to 25 prevent reverse current flow. This eliminates the need for additional diodes for reverse current prevention.

Figure 5:
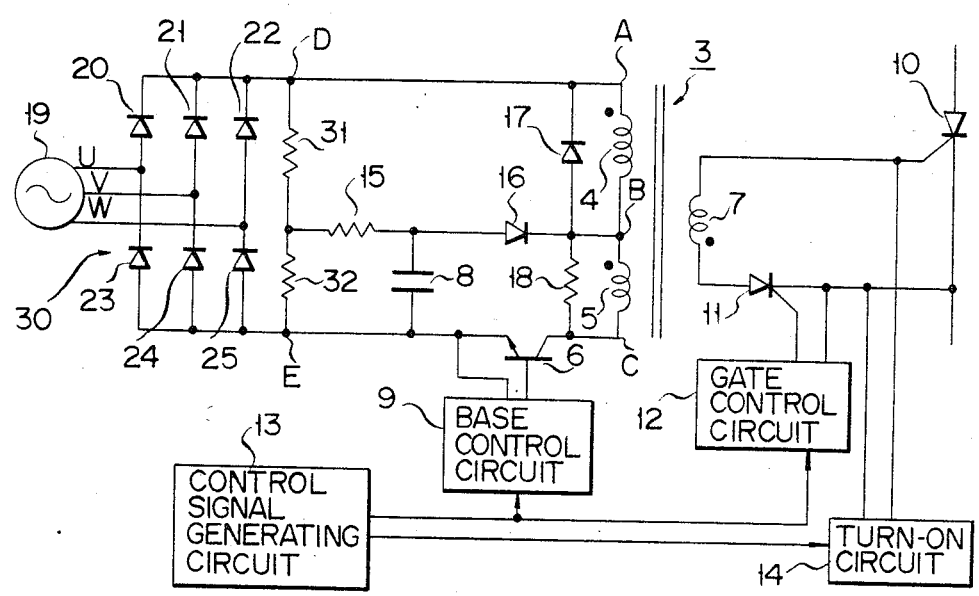
FIG. 5 is a circuit diagram of another embodiment of a turn-off circuit for GTOs constructed according to the present invention.

FIG. 5 shows another embodiment of a turn-off circuit for GTOs according to the present invention. As shown, this embodiment uses four additional resistors 15, 18, 31 and 32, and two diodes 16 and 17 compared to the embodiment of FIG. 3. The load resistors 31 and 32 are connected in series between a pair of low and high potential output terminals (points D and E) of the rectifier 30. The resistor 15 and the diode 16 are connected in series between the junction of the resistors 31 and 32 and the junction of the primary windings 4 and 5. The diode 16 is connected at the anode to one end of the resistor 15, and at the cathode to the junction between the primary windings 4 and 5. The resistors 31 and 32 are for providing a current path to the resistor 15. The capacitor 8 is connected to the junction between the resistor 15 and the diode 16 and the lower potential terminal of the rectifier 30. The diode 16 is for preventing reverse current flow into the capacitor 8.

The diode 17 is connected in parallel with the primary winding 4. The resistor 18 is connected in parallel with the primary winding 5. The diode 17 is also connected at the cathode to the high potential terminal of the rectifier 30, and at the anode of the junction point B of the primary windings 4 and 5. The combination of the diode 17 and the resistor 18 is for providing a circulating path to the exciting energy of the primary windings 4 and 5. This embodiment can turn off the GTO through a similar operation to that of the FIG. 3 embodiment except that the charged voltage across the capacitor 8 is R31/R32×V$_{AV}$ (R31, R32 are resistance values of the resistors 31, 32, respectively) and the diodes 20 to 25 are forward-biased when the voltage across the capacitor 8 becomes to E/2. This embodiment can attain substantially the same effects.

Figure 6:
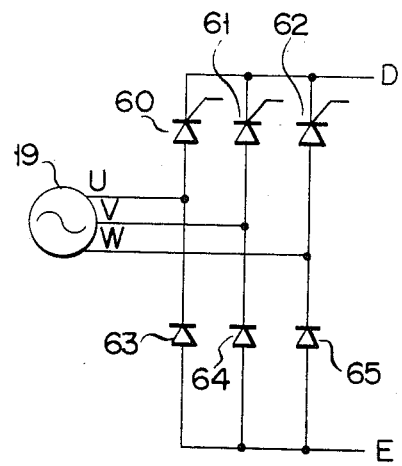
FIG. 6 is a circuit diagram of another three-phase full wave rectifier usable in the turn-off circuits in FIGS. 3 and 5.

FIG. 6 shows another arrangement of the three-phase full-wave rectifier 30 incorporated into the FIG. 5 embodiment. As shown, this embodiment employs a hybrid bridge containing three thyristors 60 to 62, and three diodes 63 to 65. The thyristor 60 and the diode 63 are connected in series. Similarly, the thyristor 61 and the diode 64, and the thyristor 62 and the diode 65 are respectively connected in series. Those series circuits are connected in parallel to each other. The cathodes of the thyristors are connected together, providing a high potential terminal of the rectifier 30. The anodes of the diodes are also connected together, providing a lower potential terminal. Power voltages U, V, and W are coupled with junctions between those thyristors and diodes, respectively. The mean value of the rectified voltage of the three-phase full-wave rectifiers of FIG. 5 or 6 is approximatey 96% of the peak value V$_p$, and this value is large enough to turn off the GTO. The lower limit value V$_B$ of the output voltage of the rectifier is relatively small, i.e. approximately 87% of the peak value V$_p$. If necessary, however, this value can be increased to a practical value by appropriately increasing the peak value. Thus, the rectifier voltage of the rectifier in question can provide to the GTO the turn-off current of an amplitude larger enought to turn off the GTO, even if the GTO has a large capacity and a high operating frequency.

As seen from the foregoing description, the turn-off circuit for GTOs according to the present invention employs the output voltage of three-phase full-wave rectifier, which is generally used as a drive power source in the apparatus incorporating the GTOs, for the voltage to turn off the GTO. This feature eliminates the need for the DC power source and the large capacitor associated therewith. Further, since the rectified voltage from the three-phase full-wave rectifier is used, the turn-off circuit according to this invention can easily cope with increased power source capacity resulting from increased capacity and operating frequency of the GTO. The diodes in the three-phase full-wave rectifier prevent reverse current flow, eliminating the need for the diode used exclusively for preventing reverse current. With the removal of the factors which increase the size of the turn-off circuit, for example, the DC power supply for the turning off operation and its associated large capacitor, the turn-off circuit for GTOs is reduced in size, weight and cost.

While in the above-mentioned embodiments the turn ratio of the primary windings is 1:1, the ratio may be varied as required. The switching elements, such as the transistor and the thyristor, may be replaced by the FET (field effect transistor), GTO or SIT (electrostatic inductive thyristor), for example. Additionally, the thyristor 11 may be replaced by a diode arranged in the same conductive direction. The two separated primary windings may be substituted by a single continuous winding with a center tap.

It should be understood that the present invention may variously be changed and modified within the scope of the present invention.

What is claimed is:

1. A turn-off circuit for a gate turn-off thyristor comprising:
   a three-phase full-wave rectifier for full-wave rectifying three-phase AC voltages, and having a pair of output terminals;
   a pulse transformer having primary and secondary windings;
   a switching element;
   said primary winding of said pulse transformer and said switching element connected in series between said pair of output terminals of said rectifier;
   a charge/discharge capacitor connected at one end to one of the pair of said output terminals of said rectifier, and at the other end to a predetermined point of said primary winding;
   a gate turn-off thyristor connected to receive a turn-off current through said secondary winding of said pulse transformer; and
   a control ciruit for receiving a turn-off signal with a predetermined pulse width to turn on said switching element so that said gate turn-off thyristor receives a turn-off current through said secondary winding of said pulse transformer and is turned off.

2. The turn-off circuit according to claim 1, in which said other end of said charge/discharge capacitor is directly connected to the predetermined point of said primary winding.

3. The turn-off circuit according to claim 1, in which said charge/discharge capacitor is connected at said other end to the predetermined point on said primary winding through a diode and to the other terminal of said output terminal pair of said rectifier through resistors.

4. The turn-off circiut according to claim 1, in which said predetermined point of said primary winding is a mid-potential point.

5. The turn-off circuit according to claim 1, in which said primary winding is two separated winding sections.

6. The turn-off circuit according to claim 1, in which said rectifier is comprised of diodes.

7. The turn-off circuit according to claim 1, in which said rectifier is a combination of thyristors and diodes.

8. The turn-off circuit according to claim 1, in which said switching element is a bipolar transistor.

* * * * *